(12) United States Patent
Rueger et al.

(10) Patent No.: US 9,575,130 B2
(45) Date of Patent: Feb. 21, 2017

(54) METHOD FOR DETERMINING THE CAPACITY OF A BATTERY CELL

(71) Applicant: Robert Bosch GmbH, Stuttgart (DE)

(72) Inventors: Michael Rueger, Munich (DE); Andre Boehm, Marbach am Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/031,783

(22) PCT Filed: Oct. 6, 2014

(86) PCT No.: PCT/EP2014/071282
§ 371 (c)(1),
(2) Date: Apr. 25, 2016

(87) PCT Pub. No.: WO2015/058947
PCT Pub. Date: Apr. 30, 2015

(65) Prior Publication Data
US 2016/0245872 A1    Aug. 25, 2016

(30) Foreign Application Priority Data

Oct. 24, 2013 (DE) .................. 10 2013 221 589

(51) Int. Cl.
*H01M 10/48* (2006.01)
*G01D 21/00* (2006.01)
(Continued)

(52) U.S. Cl.
CPC ....... *G01R 31/3624* (2013.01); *G01R 31/3606* (2013.01); *G01R 31/3651* (2013.01);
(Continued)

(58) Field of Classification Search
None
See application file for complete search history.

(56) References Cited

U.S. PATENT DOCUMENTS 7,136,762 B2 * 11/2006 Ono .................... G01R 31/361
                                                      320/132
7,339,351 B2 *  3/2008 Murakami ............ B60L 3/0046
                                                      320/132
(Continued)

FOREIGN PATENT DOCUMENTS

JP         2011257226         12/2011

OTHER PUBLICATIONS

International Search Report for Application No. PCT/EP2014/071282 dated Jan. 5, 2015 (English Translation, 2 pages).
(Continued)

*Primary Examiner* — Edward Cosimano
(74) *Attorney, Agent, or Firm* — Michael Best & Friedrich LLP

(57) ABSTRACT

The invention relates to a method for determining the capacity of a battery cell. A battery cell current I is measured during a measurement period, and an open terminal voltage $U_{OCV1}, U_{OCV2}$ of the battery cell is measured at the beginning and end of the measuring period. The method has the steps of ascertaining a total battery cell current $I_{ges}$ from the measured battery cell current I, ascertaining charge states $SOC_1$, $SOC_2$ at the beginning and end of the measurement period using the measured open terminal voltage $U_{OCV1}$, $U_{OCV2}$, ascertaining an estimated value of the capacity $Q_{est}$ using the total battery cell current $I_{ges}$ and a difference between the charge states $SOC_1$, $SOC_2$, ascertaining a total measurement error of the estimated value of the capacity $Q_{est}$ from measurement errors of the total battery cell current $I_{ges}$ and the charge states $SOC_1$, $SOC_2$, and ascertaining a new value of the capacity $Q_{new}$ using a known value of the capacity $Q_{act}$, the estimated value of the capacity Q, and the total measurement error. The new value of the capacity $Q_{new}$ is in a monotonic relationship with the known value of the capacity $Q_{act}$ and the estimated value of the capacity $Q_{est}$ (Continued)

such that the new value of the capacity $Q_{new}$ is determined more strongly from the estimated value of the capacity $Q_{est}$ in the case of at least one first value of the total measurement error than in the case of at least one second value of the total measurement error, said second value lying above the at least one first value, and the new value of the capacity $Q_{new}$ is determined less strongly from the known value of the capacity $Q_{est}$ in the case of the first value of the value of the total measurement error than in the case of the second value of the total measurement error. The invention further relates to a computer program, a battery management system (2), and a motor vehicle which are designed to carry out the method.

12 Claims, 4 Drawing Sheets

(51) Int. Cl.
  *G06F 17/40* (2006.01)
  *G06F 19/00* (2011.01)
  *G01R 31/36* (2006.01)
(52) U.S. Cl.
  CPC ........ *G01R 31/3679* (2013.01); *H01M 10/48* (2013.01); *G01D 21/00* (2013.01); *G06F 17/40* (2013.01); *G06F 19/00* (2013.01)

(56) References Cited

U.S. PATENT DOCUMENTS

| | | |
|---|---|---|
| 2005/0017725 A1* | 1/2005 | Murakami ............ B60L 3/0046 324/426 |
| 2005/0154544 A1* | 7/2005 | Ono ..................... G01R 31/361 702/63 |
| 2008/0238371 A1 | 10/2008 | Tamezane |
| 2010/0138178 A1 | 6/2010 | Paryani et al. |
| 2011/0234167 A1 | 9/2011 | Kao et al. |
| 2012/0072145 A1 | 3/2012 | Zhang et al. |
| 2012/0290234 A1 | 11/2012 | Schaefer |

OTHER PUBLICATIONS

International Written Opinion for Application No. PCT/EP2014/071282 dated Apr. 30, 2015 (English Translation and Original, 13 pages).

* cited by examiner

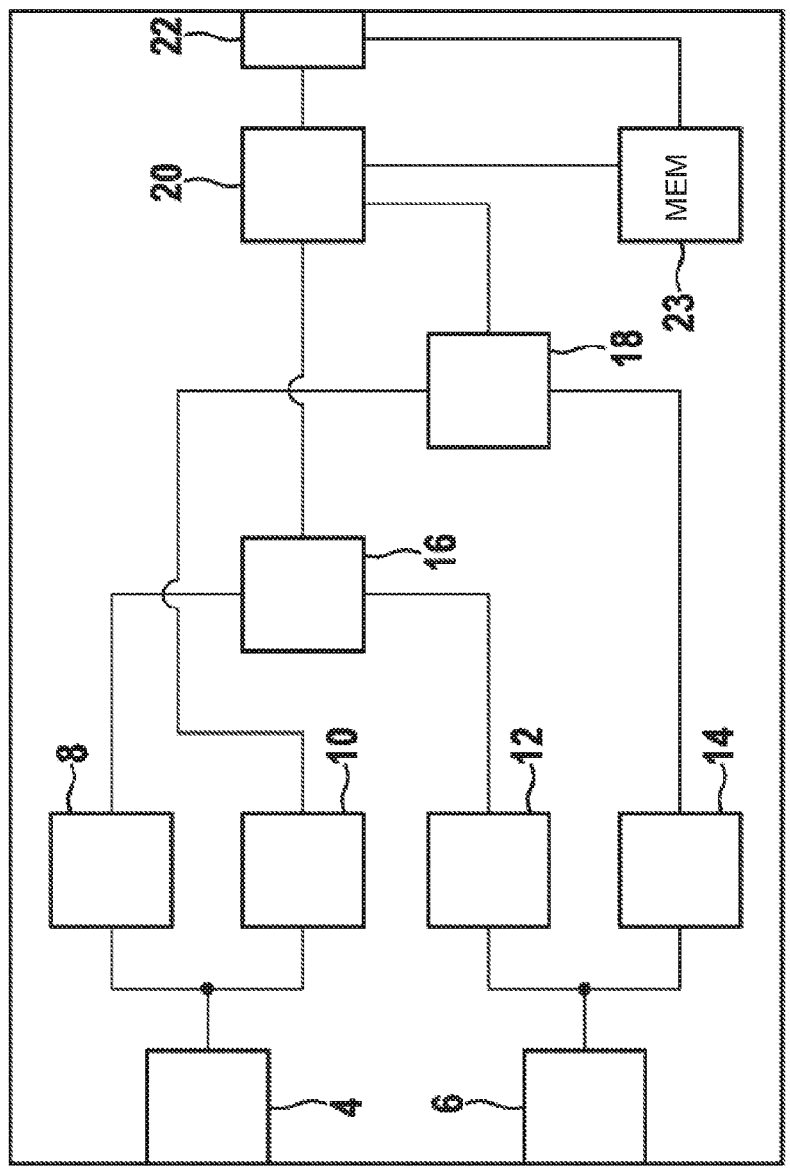
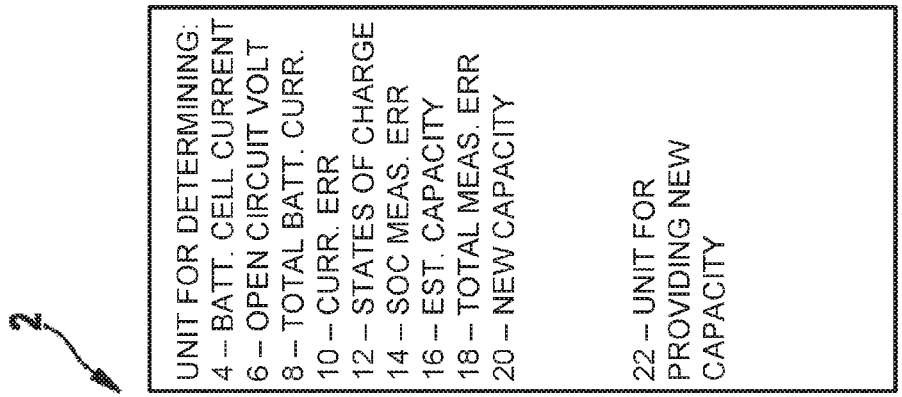
Fig. 1

METHOD FOR DETERMINING THE CAPACITY OF A BATTERY CELL

BACKGROUND OF THE INVENTION

The invention relates to a method for determining the capacity of a battery cell, and to a battery management system.

The invention additionally relates to a computer program, a battery management system, and a motor vehicle, which are designed for carrying out the method.

Battery packs using lithium-ion technology which consist of a large number of electrochemical cells connected in series are used in hybrid and electric vehicles. A battery management system serves for monitoring the battery and is intended to ensure the longest possible lifetime of the battery in addition to safety monitoring. One task of the battery management system is to ascertain a charge capacity of the cells.

JP 2011-257226 discloses a method for determining a residual capacity of a battery on the basis of a terminal voltage of the battery, wherein the error is minimized by a combination of a plurality of detection methods. The residual capacity of the battery is ascertained as that which was ascertained with a relatively low error.

SUMMARY OF THE INVENTION

In a method according to the invention for determining the capacity of a battery cell, a battery cell current I is measured during a measurement time period and an open circuit voltage $U_{OCV1}$, $U_{OCV2}$ of the battery cell is measured at the beginning and end of the measurement time period. The method comprises the following steps:
a) determining a total battery cell current $I_{tot}$ from the measured battery cell current I,
b) determining states of charge $SOC_1$, $SOC_2$ at the beginning and end of the measurement time period on the basis of the measured open circuit voltage $U_{OCV1}$, $U_{OCV2}$,
c) determining an estimated value of the capacity $Q_{est}$ on the basis of the total battery cell current $I_{tot}$ and a difference between the states of charge $SOC_1$, $SOC_2$,
d) determining a total measurement error $$\frac{\Delta Q}{Q}$$

of the estimated value of the capacity $Q_{est}$ from measurement errors of the total battery cell current $I_{tot}$ and the states of charge $SOC_1$, $SOC_2$,
e) determining a new value of the capacity $Q_{new}$ on the basis of a known value of the capacity $Q_{act}$, the estimated value of the capacity $Q_{est}$ and the total measurement error $$\frac{\Delta Q}{Q},$$

In this case, it is provided that the new value of the capacity $Q_{new}$ is in a monotonic relationship with the known value of the capacity $Q_{act}$ and the estimated value of the capacity $Q_{est}$ such that in the case of at least one first value of the total measurement error $$\frac{\Delta Q}{Q}$$

the new value of the capacity $Q_{new}$ is ascertained from the estimated value of the capacity $Q_{est}$ to a greater extent than in the case of at least one second value of the total measurement error $$\frac{\Delta Q}{Q}$$

which lies above the at least one first value, and in the case of the first value of the total measurement error $$\frac{\Delta Q}{Q}$$

the new value of the capacity $Q_{new}$ is ascertained from the known value of the capacity $Q_{act}$ to a lesser extent than in the case of the second value of the total measurement error $$\frac{\Delta Q}{Q}.$$

The known value of the capacity $Q_{act}$ is updated and becomes the new value of the capacity $Q_{new}$. In the case of high measurement errors, the new value of the capacity $Q_{new}$ is altered by the measurement to a not very great extent, whereas in the case of low measurement errors the new value of the capacity $Q_{new}$ is altered by the measurement to a greater extent. As a result, a new quality of the estimation of the capacity of the battery is achieved, wherein the quality has a weighting between the currently known value of the capacity $Q_{act}$ and the estimated value of the capacity $Q_{est}$. This is expedient because the capacity of the cell changes relatively slowly in comparison with the frequency of the measurement. By way of example, approximately one capacity measurement per week is carried out. That is contrasted with the reduction of the capacity by 20% in approximately 10 years.

In the context of the invention a monotonic relationship between two variables denotes a functional relationship in which a higher value of the first variable is always linked with a constant or higher value of the second variable. Such a monotonic relationship between the new value of the capacity $Q_{new}$ and the known value of the capacity $Q_{act}$ can be present over the entire value range of the total measurement error $$\frac{\Delta Q}{Q}$$

or in sections exponentially or polynomially, in particular quadratically, linearly or proportionally. The monotonic relationship between the new value of the capacity $Q_{new}$ and the estimated value of the capacity $Q_{est}$ can also be present over the entire value range of the total measurement error $$\frac{\Delta Q}{Q}$$

or in sections exponentially or polynomially, in particular quadratically, linearly or proportionally.

According to a further preferred embodiment, the new value of the capacity $Q_{new}$ below a first threshold value of the total measurement error $$\frac{\Delta Q}{Q}$$

is ascertained substantially by the estimated value of the capacity $Q_{est}$. "Substantially" means that the new value of the capacity is equal to the estimated value of the capacity $Q_{est}$, or that it is equal to the estimated value of the capacity $Q_{est}$ to a high percentage, below the first threshold value of the total measurement error $$\frac{\Delta Q}{Q}$$

always more than 90%. As a result, measurements which have produced an excessively low error are almost completely accepted.

According to one preferred embodiment, the new value of the capacity $Q_{new}$ above a second threshold value of the total measurement error $$\frac{\Delta Q}{Q}$$

is ascertained substantially by the known value of the capacity $Q_{act}$. "Substantially" means that the new value of the capacity is equal to the known value of the capacity $Q_{act}$, or that it is equal to the known value of the capacity $Q_{act}$ to a high percentage, above the second threshold value of the total measurement error $$\frac{\Delta Q}{Q}$$

always more than 90%. As a result, measurements which have produced an excessively high error are completely or almost completely rejected.

In accordance with one preferred embodiment, the method comprises the following further step:
f) determining a weight factor W, wherein the weight factor W is in a monotonic relationship with the total measurement error $$\frac{\Delta Q}{Q},$$

and wherein the new value of the capacity $Q_{new}$ is determined in step f) on the basis of the following formula:

$$Q_{new} = Q_{act} + W \cdot Q_{est} - W \cdot Q_{act}$$

In this case, W is a weight factor which is also in a monotonic relationship in each case with the measurement errors of the total battery cell current $I_{tot}$ and the states of charge $SOC_1$, $SOC_2$, such that a higher measurement error of one of the variables leads to a higher weight factor.

In this case, the weight factor can be determined on the basis of a table, for example, wherein the table has at least two, preferably two to ten, ranges of the total measurement error $$\frac{\Delta Q}{Q}$$

which are linked with different weight factors. By way of example, the table can demonstrate a low error range, a medium error range and a high error range and the weight factor within the ranges can in each case be constant or rise linearly.

Preferably, the total battery cell current is determined in step a) by the integration of the measured battery cell current over the measurement time period, that is to say according to $$I_{tot} = \int_{t_1}^{t_2} I \, dt.$$

According to one preferred embodiment, the estimated value of the capacity $Q_{est}$ is determined in step c) on the basis of a quotient of the total battery cell current $I_{tot}$ and a difference between the states of charge $SOC_1$, $SOC_2$, preferably in accordance with $$Q = \frac{1}{36} \cdot \frac{I_{tot}}{SOC_2 - SOC_1},$$

wherein 1/36 is a scaling factor due to the conversion of the capacity to the unit Ah and an indication in %.

One criterion for the quality of the capacity determination is the relative error resulting from laws of the provocation of measurement uncertainties. The total measurement error $$\frac{\Delta Q}{Q}$$

of the estimated value of the capacity $Q_{est}$ is therefore determined from measurement errors of the total battery cell current $I_{tot}$ and the states of charge $SOC_1$, $SOC_2$, preferably in accordance with $$\frac{\Delta Q}{Q} = \sqrt{\left(\frac{\Delta I_{tot}}{I_{tot}}\right)^2 + \left(\frac{\Delta SOC_2 + \Delta SOC_1}{SOC_2 - SOC_1}\right)^2}.$$

According to one preferred embodiment, the states of charge $SOC_1$, $SOC_2$ at the beginning and end of the measurement time period are determined in step b) on the basis of a characteristic curve of the behavior of the state of charge as a function of the measured open circuit voltage and the measurement errors $\Delta SOC_1$, $\Delta SOC_2$ of the states of charge $SOC_1$, $SOC_2$ are determined by the linearization of the characteristic curve from errors of the measured open circuit voltage $U_{OCV1}$, $U_{OCV2}$.

According to one preferred embodiment, the measurement error of the states of charge $SOC_1$, $SOC_2$ is determined on the basis of the following formula:

$$\Delta SOC = \left| \frac{\partial SOC}{\partial U_{OCV}} \right| \Delta U_{OCV}.$$

In this case, the derivative of the SOC-$U_{OCV}$ characteristic curve is preferably linearly approximated by $$\left| \frac{\partial SOC}{\partial U_{OCV}} \right| \approx \frac{SOC(U_{OCV} + \Delta U_{OCV}) - SOC(U_{OCV} - \Delta U_{OCV})}{(U_{OCV} + \Delta U_{OCV}) - (U_{OCV} - \Delta U_{OCV})}.$$

According to one preferred embodiment, the beginning and the end of the measurement time period in each case adjoin a relaxation time period of the battery cell.

The invention furthermore proposes a computer program according to which one of the methods described herein is carried out if the computer program is executed on a programmable computer device. The computer program can be, for example, a module for implementing a battery management system of a vehicle. The computer program can be stored on a machine-readable storage medium, for instance on a permanent or rewritable storage medium, or in assignment to a computer device, for example on a portable memory, such as a CD-ROM, DVD, a USB stick or a memory card. In addition or as an alternative thereto, the computer program can be provided on a computer device, such as, for instance, on a server or a cloud server, for downloading, for example via a data network, such as the internet, or a communication connection, such as, for instance, a telephone line or a wireless connection.

According to a further aspect, a battery management system designed for carrying out one of the methods described comprises a) a unit for determining a battery cell current I,
b) a unit for determining an open circuit voltage $U_{OCV1}$, $U_{OCV2}$ of a battery cell,
c) a unit for determining a total battery cell current $I_{tot}$ from the measured battery cell current I,
d) a unit for determining states of charge $SOC_1$, $SOC_2$ at the beginning and end of the measurement time period on the basis of the measured open circuit voltages $U_{OCV1}$, $U_{OCV2}$,
e) a unit for determining an estimated value of the capacity $Q_{est}$ on the basis of the total battery cell current $I_{tot}$ and a difference between the determined states of charge $SOC_1$, $SOC_2$,
f) a unit for determining a total measurement error $$\frac{\Delta Q}{Q}$$

of the estimated value of the capacity $Q_{est}$ from measurement errors of the total battery cell current $I_{tot}$ and the states of charge $SOC_1$, $SOC_2$,
g) a unit for determining a new value of the capacity $Q_{new}$ on the basis of a known value of the capacity $Q_{act}$, the estimated value of the capacity $Q_{est}$ and the total measurement error $$\frac{\Delta Q}{Q},$$

and
i) a unit for providing the new value of the capacity $Q_{new}$ of the battery cell.

The invention additionally provides a motor vehicle comprising such a battery, wherein the battery is connected to a drive system of the motor vehicle. The method is preferably applied to electrically driven vehicles in which a multiplicity of battery cells are interconnected for providing the necessary drive voltage.

BRIEF DESCRIPTION OF THE DRAWINGS

Exemplary embodiments of the invention are illustrated in the drawings and are explained in greater detail in the following description.

In the figures:

FIG. 1 shows a battery management system according to one embodiment of the invention.

DETAILED DESCRIPTION

In the present description, the terms "battery" and "battery cell" are used for rechargeable battery and rechargeable battery cell, respectively, in a manner adapted to customary linguistic usage. The battery preferably comprises one or a plurality of battery units which can have a battery cell, a battery module, a module string or a battery pack. In this case, the battery cells are preferably spatially combined and connected to one another in terms of circuitry, for example interconnected serially or in parallel to form modules. A plurality of modules can form so-called battery direct converters (BDCs) and a plurality of battery direct converters can form a battery direct inverter (BDI).

FIG. 1 shows a battery management system 2 in accordance with one embodiment of the present invention.

The battery management system 2 comprises a unit 4 for determining a battery cell current, which measures the current of lithium-ion batteries with a typical voltage range of 2.8 to 4.2 V. The unit 4 for determining the battery cell current is coupled to a unit 8 for determining a total battery cell current $I_{tot}$ from the measured battery cell current I, which unit sums or integrates the battery cell current I over time in accordance with $$I_{tot} = \int_{t_1}^{t_2} I \, dt.$$

The unit 4 for determining the battery cell current I is additionally coupled to a unit 10 for determining a measurement error of the total battery cell current $I_{tot}$, which unit determines the error of the current integral preferably from the measured current $I_m$ and non-measurable self-discharge $I_{sd}$ in accordance with $$\Delta \int_{t_{on,1}}^{t_{on,2}} I dt = \Delta \int_{t_{on,1}}^{t_{off,1}} I_m dt + \Delta \int_{t_{on,1}}^{t_{on,2}} I_{sd} dt$$

since the current integral is calculated from the measured current $I_m$ and non-measurable self-discharge $I_{sd}$, i.e. in accordance with $$\int_{t_{on,1}}^{t_{on,2}} I dt = \int_{t_{on,1}}^{t_{off,1}} I_m dt + \int_{t_{on,1}}^{t_{on,2}} I_{sd} dt.$$

In this case, the self-discharge is preferably estimated as a constant value. In this exemplary embodiment, the error of the self-discharge, since it can only be estimated, is assumed to be 100% and is thus $$\Delta \int_{t_{on,1}}^{t_{on,2}} I_{sd} dt = \int_{t_{on,1}}^{t_{on,2}} I_{sd} dt = I_{sd}(t_{on,2} - t_{on,1}).$$

In the case of the error of the current integral, in addition, a multiplicative error $I_{gain}$ and an additive error $I_{bias}$ are preferably taken into account in accordance with $$\Delta \int_{t_{on,1}}^{t_{off,1}} I_m dt = \Delta I_{gain} \cdot \int_{t_{on,1}}^{t_{off,1}} I_m dt + \Delta I_{bias}(t_{off,1} - t_{on,1}),$$

wherein the multiplicative error $I_{gain}$ concerns a known sensitivity deviation of the measuring instrument and the additive error $I_{bias}$ concerns a known zero point deviation and, if appropriate, a known quantization deviation.

Figure 3:
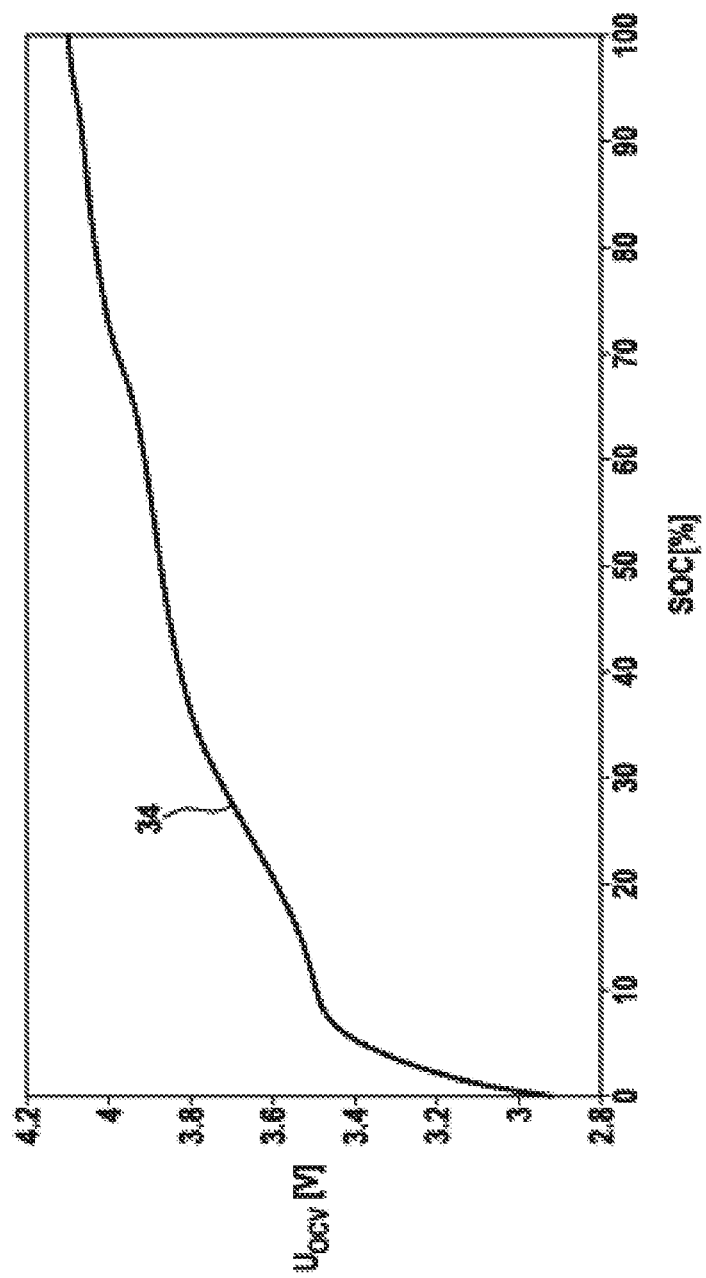
FIG. 3 shows one example of a characteristic curve of SOC and $U_{OCV}$.

The battery management system 2 additionally comprises a unit 6 for determining an open circuit voltage $U_{OCV}$ of a battery cell. The unit 6 for determining the open circuit voltage $U_{OCV}$ of the battery cell is coupled to a unit 12 for determining states of charge $SOC_1$, $SOC_2$ at the beginning and end of the measurement time period on the basis of the measured open circuit voltages $U_{OCV1}$, $U_{OCV2}$, which unit determines the states of charge $SOC_1$, $SOC_2$ on the basis of an SOC-$U_{OCV}$ characteristic curve. One exemplary characteristic curve is illustrated in FIG. 3.

The unit 6 for determining the open circuit voltage $U_{OCV}$ of the battery cell is additionally coupled to a unit 14 for determining a measurement error of the states of charge $SOC_1$, $SOC_2$, which measurement error is, for example, based on $$\Delta SOC = \left|\frac{\partial SOC}{\partial U_{OCV}}\right| \Delta U_{OCV},$$

wherein the derivative of the SOC-$U_{OCV}$ characteristic curve is approximated by $$\left|\frac{\partial SOC}{\partial U_{OCV}}\right| \approx \frac{SOC(U_{OCV} + \Delta U_{OCV}) - SOC(U_{OCV} - \Delta U_{OCV})}{(U_{OCV} + \Delta U_{OCV}) - (U_{OCV} - \Delta U_{OCV})}$$

for example in accordance with $$\left|\frac{\partial SOC}{\partial U_{OCV}}\right| \approx \frac{SOC(U_{OCV} + 5 \text{ mV}) - SOC(U_{OCV} - 5 \text{ mV})}{(U_{OCV} + 5 \text{ mV}) - (U_{OCV} - 5 \text{ mV})}.$$

The $U_{OCV}$ error $\Delta U_{OCV}$ is composed of a measurement accuracy $\Delta U_m$ and a deviation $\Delta U_{OCV\ relaxation}$, which Results from the Preloading of the Cell if the Cell does not have Enough Time to recover from a current loading:

$$\Delta U_{OCV} = \Delta U_m + \Delta U_{OCV\ relaxation}.$$

The recovery of the open circuit voltage $U_{OCV}$ is dependent on recovery time, temperature and SOC, and thus also the errors thereof:

$$\Delta U_{OCV\ relaxation} = f(SOC, \text{Temp}, \text{offtime}).$$

Since this function f is not known analytically, an exponential decay of a maximum deviation from the $U_{OCV}$ in the relaxed state is assumed as an estimation for the error as a result of the preloading of the cell, $$\Delta U_{OCV\ relaxation} = \Delta U_{OCV\ relatxation\ max} \cdot \exp(-t/\tau_{relax}).$$

The function assumed here for describing the relaxation could also be a different function, for example a logarithmic function, polynomial function, in particular a linear function, or else a function defined differently in sections.

The battery management system 2 comprises a further unit 16 for determining an estimated capacity $Q_{est}$, which unit receives data of the unit 8 for determining the total battery cell current $I_{tot}$ and data of the unit 12 for determining the states of charge $SOC_1$, $SOC_2$ and processes said data further. The unit 16 for determining the estimated capacity $Q_{est}$ determines the estimated capacity $Q_{est}$ for example on the basis of $$Q = \frac{1}{36} \cdot \frac{I_{tot}}{SOC_2 - SOC_1}, \text{ i.e.}$$

$$Q = \frac{1}{36} \cdot \frac{\int_{t_1}^{t_2} I dt}{SOC(U_{OCV}(t_2)) - SOC(U_{OCV}(t_1))}.$$

wherein 1/36 is a scaling factor due to the conversion of the capacity to the unit Ah and an indication in %.

The battery management system 2 comprises a further unit 18 for determining a total measurement error $$\frac{\Delta Q}{Q}$$

from measurement errors of the total battery cell current $I_{tot}$ and the states of charge $SOC_1$, $SOC_2$, which unit receives data of the unit 10 for determining the measurement error of the total battery cell current $I_{tot}$ and data of the unit 14 for determining the measurement error of the states of charge $SOC_1$, $SOC_2$ and processes said data further. The total measurement error $$\frac{\Delta Q}{Q}$$

is determined for example on the basis of $$\frac{\Delta Q}{Q} = \sqrt{\left(\frac{\Delta I_{tot}}{I_{tot}}\right)^2 + \left(\frac{\Delta SOC_2 + \Delta SOC_1}{SOC_2 - SOC_1}\right)^2}, \text{ i.e.}$$

$$\frac{\Delta Q}{Q} = \sqrt{\left(\frac{\Delta \int_{t_1}^{t_2} I \, dt}{\int_{t_1}^{t_2} I \, dt}\right)^2 + \left(\frac{\Delta SOC(U_{OCV}(t_2)) + \Delta SOC(U_{OCV}(t_1))}{SOC(U_{OCV}(t_2)) - SOC(U_{OCV}(t_1))}\right)^2}.$$

The battery management system 2 comprises a further unit 20 for determining a new value of the capacity $Q_{new}$ on the basis of the estimated value of the capacity $Q_{est}$, the total measurement error $$\frac{\Delta Q}{Q}$$

and on the basis of a known value of the capacity $Q_{act}$. The unit 20 for determining the new value of the capacity $Q_{new}$ receives data from the unit 16 for determining the estimated value of the capacity $Q_{est}$ and data from the unit 18 for determining the total measurement error $$\frac{\Delta Q}{Q}.$$

The unit 20 for determining the new value of the capacity $Q_{new}$ additionally receives a known value of the capacity $Q_{act}$ stored in a memory 23, for example a nonvolatile memory of the battery management system 2. The known value of the capacity $Q_{act}$ can also be provided to the battery management system 2 in some other way, for example via a communication line (not illustrated).

In the unit 20, the value for the error of the estimation is rescaled with respect to a weight factor W which updates the currently valid capacity $Q_{act}$ to the new value $Q_{new}$ in accordance with $$Q_{new} = W \cdot Q_{est} + (1-W) \cdot Q_{act}.$$

The battery management system 2 additionally comprises a unit 22 for providing the new value of the capacity $Q_{new}$, which unit receives the data of the unit 20 for determining the new value of the capacity $Q_{new}$ and processes said data further. In this embodiment, the unit 22 for providing the determined new value of the capacity $Q_{new}$ additionally has write access rights to the memory 23 in order to store the determined new value of the capacity $Q_{new}$ as an updated value of the known value of the capacity $Q_{act}$ in the memory 23 of the battery management system 2.

Figure 2:
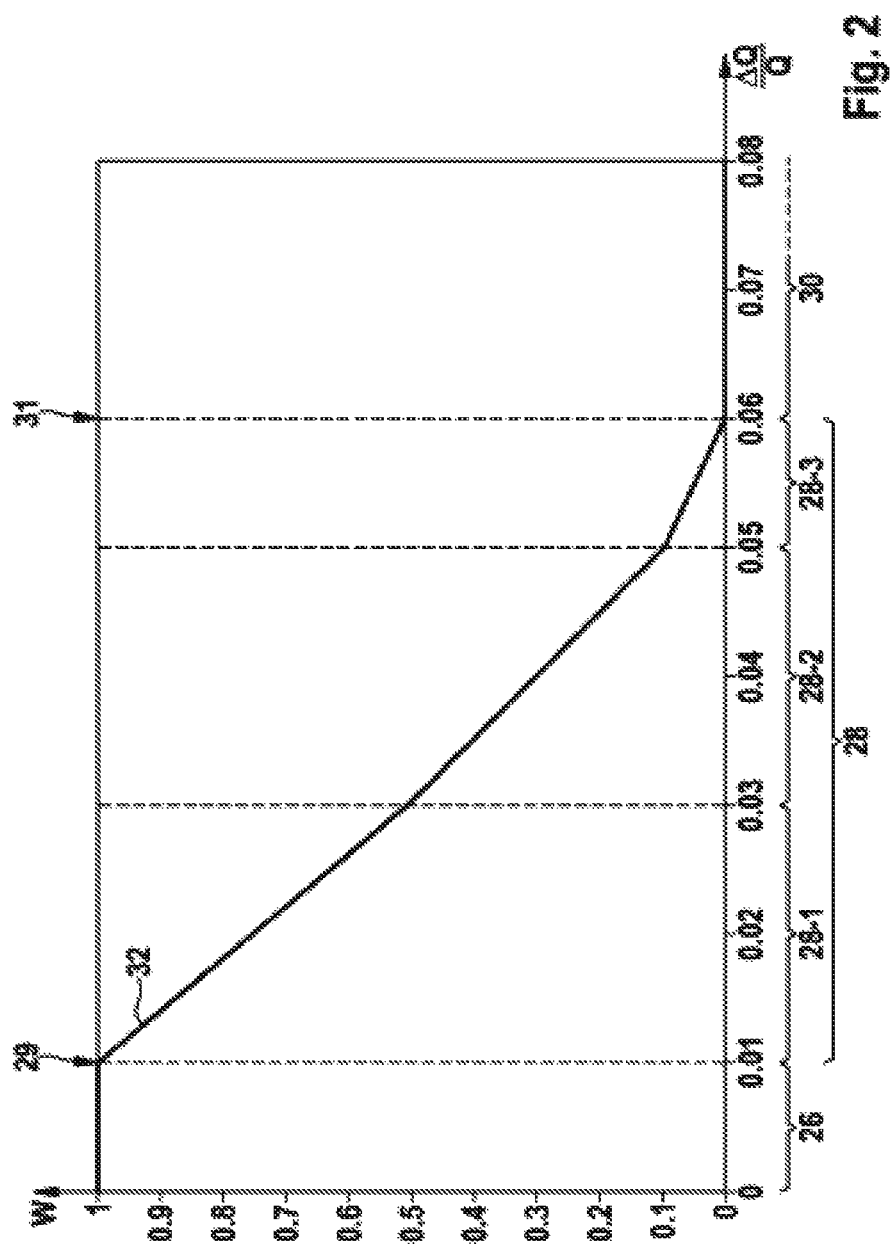
FIG. 2 shows an exemplary dependence of a weight factor on a total measurement error $$\frac{\Delta Q}{Q},$$

FIG. 2 shows an exemplary profile 32 of a weight factor W as a function of a total measurement error $$\frac{\Delta Q}{Q}.$$

The profile 32 substantially comprises three ranges, namely a first range 26 below a first threshold value 29 of the total measurement error, in which W is 1 in a constant manner independently of the total measurement error, a second range 28, in which W is between 0 and 1 depending on the total measurement error, and a third range 30 above a second threshold value 31 of the total measurement error, in which W is equal to 0 independently of the total measurement error. The first range 26, in which W is equal to 1, corresponds to a very low total measurement error, less than 1% in the exemplary embodiment illustrated. In the second range 28, in which W is between 0 and 1, the total measurement error is between 1% and 6%. The third range 30, in which W is equal to 0, corresponds to a total measurement error of above 6%.

In the exemplary embodiment illustrated, the second range 28 is subdivided into three sub ranges 28-1, 28-2, 28-3, wherein an arbitrary number of ranges, for example between 1 and 10 ranges, can be provided at this point depending on the embodiment. In the three sub ranges 28-1, 28-2, 28-3, the value of W falls from the value 1 to the value 0 with different steepnesses, in the exemplary embodiment illustrated more steeply in the first range 28-1 than in the second and third ranges 28-2, 28-3, and more steeply in the second range 28-2 than in the third range 28-3, such that the curve in the second range 28 can also be designated as convex. The weight factor W is in a monotonic relationship with the total measurement error in the entire value range, and in a strictly monotonic relationship in the second range 28, such that a higher value of the measurement error is always linked with a lower or constant value of the weight factor W. In this case, a strictly monotonic relationship means that a higher value of the measurement error is always linked with a lower value of the weight factor. The first and second threshold values 29, 31 can be defined on the basis of values in practical operation and are not restricted to the numerical values indicated. The first threshold value 29 can be a specific value between 0.1% and 2%, for example, and the second threshold value 31 can be a specific value between 3% and 10%, for example.

FIG. 3 shows an exemplary profile of a characteristic curve 34 of the open circuit voltage $U_{OCV}$ in relation to the SOC.

Here, too, a strictly monotonic relationship is evident, such that a higher state of charge SOC is always linked with a higher open circuit voltage $U_{OCV}$. The profile of the characteristic curve 34 can be the result of a large number of test series and represents the behavior of an average lithium-ion battery cell.

Figure 4:
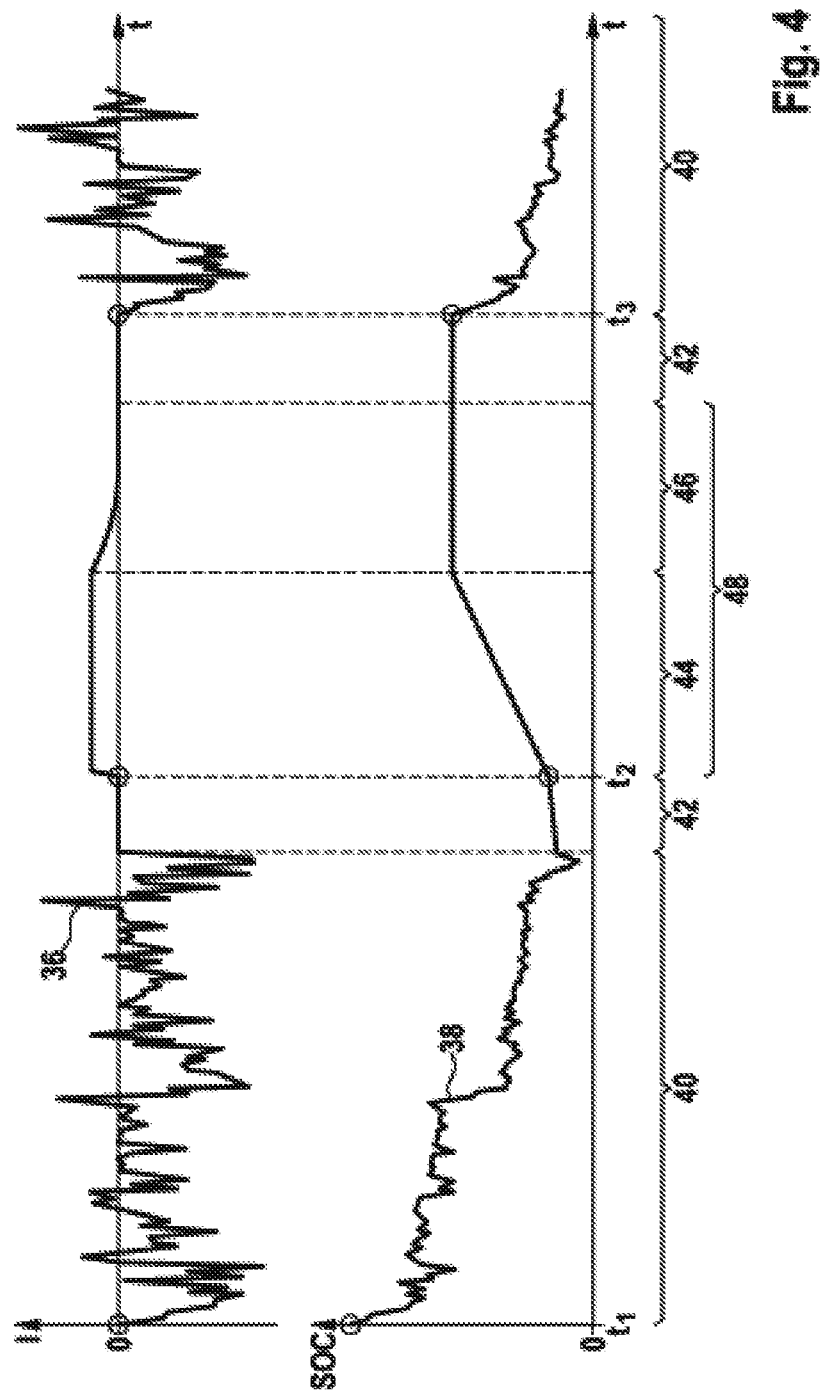
FIG. 4 shows an exemplary profile of a battery cell current and an SOC.

FIG. 4 shows an exemplary profile 36 of a battery cell current I over time t and an exemplary profile 38 of a state of charge SOC over time t. A first time period comprises an operating phase 40, in which the battery is loaded, such that both the negative values of the battery cell current I and positive values of I are present on account of support during acceleration (boost) and recovery of braking energy (recuperation). It is evident that the state of charge SOC decreases over time t in the operating phase 40. The operating phase 40 is followed by a first recuperation phase 42, in which the state of charge SOC rises slightly. The battery cell current I is constant in the recuperation phase 42. The recuperation phase 42 is followed by a charging phase 48, which comprises a first time period 44, in which charging is effected at a constant current I and a second time period 46, in which charging is effected at a constant open circuit voltage. The charging phase 48 is followed by a second recuperation phase 42, in which the battery cell current I and the state of charge SOC remain approximately constant. The second recuperation phase 42 is followed again by an operating phase 40, in which once again both current drawing processes and recuperation phases occur.

A first measurement of the open circuit voltage takes place at the end of the first recuperation phase 42 at the point in time $t_2$. A second measurement of the open circuit voltage takes place at the end of the second recuperation phase 42, that is to say at the point in time $t_3$. In addition, the total battery cell current $I_{tot}$ is determined between the measurement points in time $t_2$ and $t_3$. At the end of the second recuperation phase 42, the capacity $Q_{new}$ can be determined according to the invention by the measurement of the charge drawn.

The invention is not restricted to the exemplary embodiments described here and the aspects highlighted therein. Rather, a large number of modifications lying within the scope of action by a person skilled in the art are possible within the scope specified by the claims.

The invention claimed is:

1. A method for determining the capacity of a battery cell, wherein a battery cell current I is measured during a measurement time period and an open circuit voltage $U_{OCV1}$, $U_{OCV2}$ of the battery cell is measured at the beginning and end of the measurement time period, the method comprising:
   a) determining, by a battery management system (2), a total battery cell current $I_{tot}$ from the measured battery cell current I,
   b) determining, by the battery management system (2), states of charge $SOC_1$, $SOC_2$ at the beginning and at the end of the measurement time period on the basis of the measured open circuit voltage $U_{OCV1}$, $U_{OCV2}$,
   c) determining, by the battery management system (2), an estimated value of the capacity $Q_{est}$ on the basis of the total battery cell current $I_{tot}$ and a difference between the states of charge $SOC_1$, $SOC_2$,
   d) determining, by the battery management system (2), a total measurement error $$\frac{\Delta Q}{Q}$$

of the estimated value of the capacity $Q_{est}$ from measurement errors of the total battery cell current $I_{tot}$ and the states of charge $SOC_1$, $SOC_2$,
   e) determining, by the battery management system (2), a new value of the capacity $Q_{new}$ on the basis of a known value of the capacity $Q_{act}$, the estimated value of the capacity $Q_{est}$ and the total measurement error $$\frac{\Delta Q}{Q},$$

wherein the new value of the capacity $Q_{new}$ is in a monotonic relationship with the known value of the capacity $Q_{act}$ and the estimated value of the capacity $Q_{est}$ such that in the case of at least one first value of the total measurement error $$\frac{\Delta Q}{Q}$$

the new value of the capacity $Q_{new}$ is ascertained from the estimated value of the capacity $Q_{est}$ to a greater extent than in the case of at least one second value of the total measurement error $$\frac{\Delta Q}{Q}$$

which lies above the at least one first value, and
   in the case of the first value of the total measurement error $$\frac{\Delta Q}{Q}$$

the new value of the capacity $Q_{new}$ is ascertained from the known value of the capacity $Q_{act}$ to a lesser extent than in the case of the second value of the total measurement error $$\frac{\Delta Q}{Q};$$

wherein the battery management system (2) uses the new value of the capacity Qnew to extend the life of the battery cell.

2. The method as claimed in claim 1, characterized in that the new value of the capacity $Q_{new}$ below a first threshold value (29) of the total measurement error $$\frac{\Delta Q}{Q}$$

is ascertained using the estimated value of the capacity $Q_{est}$.

3. The method as claimed in claim 1, characterized in that the new value of the capacity $Q_{new}$ above a second threshold value (31) of the total measurement error $$\frac{\Delta Q}{Q}$$

is ascertained by the known value of the capacity $Q_{act}$.

4. The method as claimed in claim 1 comprising the following further step:
   f) determining a weight factor W, wherein the weight factor W is in a monotonic relationship with the total measurement error $$\frac{\Delta Q}{Q},$$

and wherein the new value of the capacity $Q_{new}$ is determined in step f) on the basis of the formula:

$$Q_{new} = Q_{act} + W \cdot Q_{est} - W \cdot Q_{act}$$

5. The method as claimed in claim 1, characterized in that the total battery cell current $I_{tot}$ is determined in step a) by the integration of the measured battery cell current I over the measurement time period.

6. The method as claimed in claim 1, characterized in that the estimated value of the capacity $Q_{est}$ is determined in step c) on the basis of a quotient of the total battery cell current $I_{tot}$ and a difference between the states of charge $SOC_1$, $SOC_2$.

7. The method as claimed in claim 1, characterized in that the states of charge $SOC_1$, $SOC_2$ at the beginning and end of the measurement time period are determined in step b) on the basis of a characteristic curve (34) of the behavior of the state of charge as a function of the measured open circuit voltage and the measurement errors $\Delta SOC_1$, $\Delta SOC_2$ of the states of charge $SOC_1$, $SOC_2$ are determined by the linearization of the characteristic curve (34) from errors of the measured open circuit voltage $U_{OCV1}$, $U_{OCV2}$.

8. The method as claimed in claim 1, characterized in that the measurement error of the states of charge $SOC_1$, $SOC_2$ is determined on the basis of the formula:

$$\Delta SOC = \left| \frac{\partial SOC}{\partial U_{OCV}} \right| \Delta U_{OCV}.$$

9. The method as claimed in claim 1, characterized in that the beginning and the end of the measurement time period in each case adjoin a relaxation time period of the battery cell.

10. A non-transitory computer readable medium having a computer program which when executed on a programmable computer device:
   a) determines a total battery cell current $I_{tot}$ from the measured battery cell current I,
   b) determines states of charge $SOC_1$, $SOC_2$ at the beginning and at the end of the measurement time period on the basis of the measured open circuit voltage $U_{OCV1}$, $U_{OCV2}$,
   c) determines an estimated value of the capacity $Q_{est}$ on the basis of the total battery cell current $I_{tot}$ and a difference between the states of charge $SOC_1$, $SOC_2$,
   d) determines a total measurement error $$\frac{\Delta Q}{Q}$$

of the estimated value of the capacity $Q_{est}$ from measurement errors of the total battery cell current $I_{tot}$ and the states of charge $SOC_1$, $SOC_2$,
   e) determines a new value of the capacity $Q_{new}$ on the basis of a known value of the capacity $Q_{act}$, the estimated value of the capacity $Q_{est}$ and the total measurement error $$\frac{\Delta Q}{Q},$$

wherein the new value of the capacity $Q_{new}$ is in a monotonic relationship with the known value of the capacity $Q_{act}$ and the estimated value of the capacity $Q_{est}$ such that
in the case of at least one first value of the total measurement error $$\frac{\Delta Q}{Q}$$

the new value of the capacity $Q_{new}$ is ascertained from the estimated value of the capacity $Q_{est}$ to a greater extent than in the case of at least one second value of the total measurement error $$\frac{\Delta Q}{Q}$$

which lies above the at least one first value, and
in the case of the first value of the total measurement error $$\frac{\Delta Q}{Q}$$

the new value of the capacity $Q_{new}$ is ascertained from the known value of the capacity $Q_{act}$ to a lesser extent than in the case of the second value of the total measurement error $$\frac{\Delta Q}{Q}.$$

11. A battery management system (2) comprising
a) a unit (4) for determining a battery cell current I,
b) a unit (6) for determining an open circuit voltage $U_{OCV1}$, $U_{OCV2}$ of a battery cell,
c) a unit (8) for determining a total battery cell current $I_{tot}$ from the measured battery cell current I,
d) a unit (12) for determining states of charge $SOC_1$, $SOC_2$ at the beginning and end of the measurement time period on the basis of the measured open circuit voltages $U_{OCV1}$, $U_{OCV2}$,
e) a unit (16) for determining an estimated value of the capacity $Q_{est}$ on the basis of the total battery cell current $I_{tot}$ and a difference between the determined states of charge $SOC_1$, $SOC_2$,
f) a unit (18) for determining a total measurement error $$\frac{\Delta Q}{Q}$$

of the estimated value of the capacity $Q_{est}$ from measurement errors of the total battery cell current $I_{tot}$ and the states of charge $SOC_1$, $SOC_2$,
h) a unit (20) for determining a new value of the capacity $Q_{new}$ on the basis of a known value of the capacity $Q_{act}$, the estimated value of the capacity $Q_{est}$ and the total measurement error $$\frac{\Delta Q}{Q},$$

and
i) a unit (22) for providing the new value of the capacity $Q_{new}$ of the battery cell;
wherein the battery management system (2)
a) determines a total battery cell current $I_{tot}$ from the measured battery cell current I,
b) determines states of charge $SOC_1$, $SOC_2$ at the beginning and at the end of the measurement time period on the basis of the measured open circuit voltage $U_{OCV1}$, $U_{OCV2}$,
c) determines an estimated value of the capacity $Q_{est}$ on the basis of the total battery cell current $I_{tot}$ and a difference between the states of charge $SOC_1$, $SOC_2$,
d) determines a total measurement error $$\frac{\Delta Q}{Q}$$

of the estimated value of the capacity $Q_{est}$ from measurement errors of the total battery cell current $I_{tot}$ and the states of charge $SOC_1$, $SOC_2$,
e) determines a new value of the capacity $Q_{new}$ on the basis of a known value of the capacity $Q_{act}$, the estimated value of the capacity $Q_{est}$ and the total measurement error $$\frac{\Delta Q}{Q},$$

wherein the new value of the capacity $Q_{new}$ is in a monotonic relationship with the known value of the capacity $Q_{act}$ and the estimated value of the capacity $Q_{est}$ such that in the case of at least one first value of the total measurement error $$\frac{\Delta Q}{Q}$$

the new value of the capacity $Q_{new}$ is ascertained from the estimated value of the capacity $Q_{est}$ to a greater extent than in the case of at least one second value of the total measurement error $$\frac{\Delta Q}{Q}$$

which lies above the at least one first value, and
in the case of the first value of the total measurement error $$\frac{\Delta Q}{Q}$$

the new value of the capacity $Q_{new}$ is ascertained from the known value of the capacity $Q_{act}$ to a lesser extent than in the case of the second value of the total measurement error $$\frac{\Delta Q}{Q}.$$

12. The battery management system (2) as claimed in claim 11, wherein the battery management system (2) is used in a motor vehicle.

\* \* \* \* \*